(12) United States Patent
Chan et al.

(10) Patent No.: US 8,183,869 B2
(45) Date of Patent: May 22, 2012

(54) CIRCUIT INTERRUPTER WITH CONTINUOUS SELF-TESTING FEATURE

(75) Inventors: David Chan, Bellrose, NY (US); James A. Porter, Farmingdale, NY (US); Roger M. Bradley, North Bellmore, NY (US)

(73) Assignee: Leviton Manufacturing Co., Inc., Melville, NY (US)

( * ) Notice: Subject to any disclaimer, the term of this patent is extended or adjusted under 35 U.S.C. 154(b) by 534 days.

(21) Appl. No.: 12/235,869

(22) Filed: Sep. 23, 2008
(Under 37 CFR 1.47)

(65) Prior Publication Data
US 2010/0073002 A1    Mar. 25, 2010

(51) Int. Cl.
*G01R 31/327* (2006.01)
*H02H 3/00* (2006.01)

(52) U.S. Cl. ............................. 324/424; 324/415; 361/42
(58) Field of Classification Search .................. 324/415, 324/424, 555; 361/42
See application file for complete search history.

(56) References Cited

U.S. PATENT DOCUMENTS

| | | | |
|---|---|---|---|
| 3,668,474 A | 6/1972 | Knox | |
| 4,455,654 A | 6/1984 | Bhaskar et al. | |
| 4,672,501 A * | 6/1987 | Bilac et al. .................. | 361/96 |
| 4,742,422 A | 5/1988 | Tigges | |
| 5,136,458 A | 8/1992 | Durivage, III | |
| 5,214,560 A | 5/1993 | Jenson | |
| 5,270,900 A | 12/1993 | Alden et al. | |
| 5,309,310 A | 5/1994 | Baer et al. | |
| 5,386,183 A | 1/1995 | Cronvich et al. | |
| 5,475,609 A | 12/1995 | Apothaker | |
| 5,600,524 A | 2/1997 | Neiger et al. | |
| 5,715,125 A | 2/1998 | Neiger et al. | |
| 5,875,087 A | 2/1999 | Spencer et al. | |
| 5,956,218 A * | 9/1999 | Berthold ......................... | 361/42 |
| 5,966,280 A * | 10/1999 | Cerminara et al. ............. | 361/47 |
| 5,978,191 A | 11/1999 | Bonniau et al. | |
| 5,982,593 A | 11/1999 | Kimblin et al. | |
| 6,052,265 A | 4/2000 | Zaretsky et al. | |
| 6,052,266 A | 4/2000 | Aromin | |
| 6,111,733 A | 8/2000 | Neiger et al. | |
| 6,169,405 B1 | 1/2001 | Baltzer et al. | |
| 6,191,589 B1 | 2/2001 | Clunn | |
| 6,253,121 B1 | 6/2001 | Cline et al. | |
| 6,262,871 B1 | 7/2001 | Nemir et al. | |

(Continued)

FOREIGN PATENT DOCUMENTS
WO    WO 00/14842    3/2000

*Primary Examiner* — Hoai-An D Nguyen
(74) *Attorney, Agent, or Firm* — Carter, DeLuca, Farrell & Schmidt, LLP

(57) ABSTRACT

A circuit interrupter includes a current transformer, phase conductor and neutral conductor. The phase conductor and the neutral conductor are each configured to pass through the transformer from line side to load side that are defined by the current transformer. The circuit interrupter generates a continuous test current by continuous current imbalance established between the load side of the phase conductor and the line side of the neutral conductor, or between the line side of the phase conductor and the load side of the neutral conductor. A continuous test conductor may be coupled correspondingly to establish the current imbalance. Alternatively, an integrated circuit coupled correspondingly receives power and is energized by a quiescent current thereby. The current imbalance is established by the quiescent current. The current transformer detects the quiescent current as the continuous test current. Corresponding methods are also disclosed.

49 Claims, 3 Drawing Sheets

U.S. PATENT DOCUMENTS

| | | |
|---|---|---|
| 6,292,337 B1 | 9/2001 | Legatti et al. |
| 6,370,001 B1 | 4/2002 | Macbeth |
| 6,421,214 B1 * | 7/2002 | Packard et al. .................. 361/7 |
| 6,426,632 B1 | 7/2002 | Clunn |
| 6,426,634 B1 | 7/2002 | Clunn et al. |
| 6,433,977 B1 | 8/2002 | Macbeth |
| 6,437,700 B1 | 8/2002 | Herzfeld et al. |
| 6,456,471 B1 | 9/2002 | Haun et al. |
| 6,532,424 B1 | 3/2003 | Haun et al. |
| 6,674,289 B2 | 1/2004 | Macbeth |
| 6,789,209 B1 | 9/2004 | Suzuki et al. |
| 6,807,035 B1 | 10/2004 | Baldwin et al. |
| 6,807,036 B2 | 10/2004 | Baldwin |
| 6,831,819 B2 | 12/2004 | Nemir et al. |
| 6,873,158 B2 | 3/2005 | Macbeth |
| 6,963,203 B2 * | 11/2005 | Stanisic et al. ................ 324/424 |
| 6,980,005 B2 | 12/2005 | Finlay, Sr. et al. |
| 7,149,065 B2 | 12/2006 | Baldwin et al. |
| 7,173,428 B2 | 2/2007 | Hurwicz |
| 7,177,129 B2 | 2/2007 | Arenz et al. |
| 7,195,500 B2 | 3/2007 | Huang et al. |
| 7,268,559 B1 | 9/2007 | Chen et al. |
| 7,282,921 B2 | 10/2007 | Sela et al. |
| 7,289,306 B2 | 10/2007 | Huang et al. |
| 7,295,415 B2 | 11/2007 | Huang et al. |
| 7,411,766 B1 | 8/2008 | Huang et al. |
| 7,525,402 B2 | 4/2009 | Gao |
| 7,538,557 B2 * | 5/2009 | DeHaven ...................... 324/509 |
| 7,538,993 B2 | 5/2009 | Huang et al. |
| 7,834,636 B2 * | 11/2010 | Lewinski et al. ............. 324/509 |
| 2002/0078511 A1 | 6/2002 | Blair et al. |
| 2004/0252425 A1 | 12/2004 | Baldwin et al. |
| 2005/0036250 A1 | 2/2005 | Asano |
| 2005/0063109 A1 | 3/2005 | Baldwin et al. |
| 2005/0264427 A1 | 12/2005 | Zeng et al. |
| 2006/0125622 A1 | 6/2006 | Baldwin et al. |
| 2007/0014068 A1 | 1/2007 | Huang et al. |
| 2007/0086127 A1 | 4/2007 | Huang |
| 2007/0091520 A1 | 4/2007 | Angelides et al. |
| 2007/0165342 A1 | 7/2007 | Elms |
| 2007/0208520 A1 | 9/2007 | Zhang et al. |
| 2007/0227506 A1 | 10/2007 | Perryman et al. |
| 2007/0279814 A1 | 12/2007 | Bonilla et al. |
| 2008/0002313 A1 | 1/2008 | DiSalvo et al. |
| 2008/0013227 A1 | 1/2008 | Mernyk |
| 2008/0106268 A1 * | 5/2008 | Lewinski et al. ............. 324/509 |
| 2008/0106831 A1 * | 5/2008 | Lewinski et al. ................ 361/42 |
| 2008/0109193 A1 * | 5/2008 | Lewinski et al. ................. 703/4 |
| 2009/0040667 A1 | 2/2009 | DiSalvo et al. |
| 2009/0086387 A1 * | 4/2009 | Engel .............................. 361/42 |
| 2009/0086389 A1 | 4/2009 | Huang et al. |
| 2009/0086390 A1 | 4/2009 | Huang |
| 2009/0161271 A1 | 6/2009 | Huang et al. |
| 2010/0013491 A1 | 1/2010 | Hooper et al. |

* cited by examiner

CIRCUIT INTERRUPTER WITH CONTINUOUS SELF-TESTING FEATURE

BACKGROUND

1. Field

The present application is directed to testing features related to the family of at least partially testable current interrupting devices and systems which include, without limitation, ground fault circuit interrupters (GFCI's), arc fault circuit interrupters (AFCI's), immersion detection circuit interrupters (IDCI's), appliance leakage circuit interrupters (ALCI's), circuit breakers, contactors, latching relays and solenoid mechanisms.

2. Description of the Related Art

The electrical wiring device industry has witnessed an increasing call for circuit breaking devices or systems which are designed to interrupt power to various loads, such as household appliances, consumer electrical products and branch circuits. In particular, electrical codes require electrical circuits in home bathrooms and kitchens to be equipped with ground fault circuit interrupters, for example. Presently available GFCI devices, such as the device described in commonly owned U.S. Pat. No. 4,595,894, use a trip mechanism to mechanically break an electrical connection between one or more input and output conductors. Such devices are resettable after they are tripped by, for example, the detection of a ground fault. In the device discussed in the '894 patent, the trip mechanism used to cause the mechanical breaking of the circuit (i.e., the connection between input and output conductors) includes a solenoid (or trip coil). A test button is used to test the trip mechanism and circuitry used to sense faults and a reset button is used to reset the electrical connection between input and output conductors.

Such types of devices must rely on a user to push the test button at some periodic interval and visually verify that the mechanism has disengaged the latch by looking at the reset button position. By pushing the test button, the user activates a supervisory circuit and creates an artificial ground fault in the differential transformer of the GFCI. This artificial ground fault is actually a current imbalance created by diverting current around the differential transformer. If properly operating, the GFCI senses the current imbalance and initiates a tripping pulse to disengage the latching mechanism.

SUMMARY

To advance the state of the art of testing of circuit interrupters which currently rely on a user pushing the test button, the present disclosure relates to a circuit interrupter that includes a circuit interrupting actuation circuit; and a fault current test circuit disposed and electrically coupled to the circuit interrupting actuation circuit to test at least partially the operability of the circuit interrupting actuation circuit. The fault current test circuit is disposed and configured to receive power from a power source. When the fault current test circuit is receiving power from the power source, the test circuit continuously tests at least partially the operability of the circuit interrupting circuit.

In one embodiment, the circuit interrupter may be a ground fault circuit interrupter that includes a current transformer; a phase conductor; and a neutral conductor, wherein the phase and neutral conductors each have a line side and a load side, wherein the phase conductor and the neutral conductor are each configured to pass through the transformer from the line side to the load side, and the line side and the load side of the phase and neutral conductors are defined by the current transformer, and wherein the ground fault circuit interrupter is configured to generate a continuous test current by a continuous current imbalance established one of (a) between the load side of the phase conductor and the line side of the neutral conductor, and (b) between the line side of the phase conductor and the load side of the neutral conductor. In other words, a continuous current imbalance between either (a) or (b) above, is sufficient.

In one embodiment, the ground fault circuit interrupter is configured to generate a continuous test fault current by the current imbalance being established via a continuous test conductor electrically coupling one of (a) the load side of the phase conductor and the line side of the neutral conductor; and (b) the line side of the phase conductor and the load side of the neutral conductor, respectively.

When the fault current test circuit is receiving power from the power source, the fault current test circuit continuously tests at least partially the operability of the circuit interrupting circuit via the fault current test circuit being disposed and electrically coupled to allow passage of the continuous test current by the continuous current imbalance.

The ground fault circuit interrupter may further include an integrated circuit, wherein the current transformer is a differential transformer and is electrically coupled to the integrated circuit. Additionally, the current transformer may be configured to detect the current imbalance and the integrated circuit may be configured to initiate a trip signal to decouple at least one of (1) the load side of the phase conductor from the line side of the phase conductor, and (2) the load side of the neutral conductor from the line side of the neutral conductor if the current imbalance detected by the current transformer is greater than the sum of a predetermined magnitude and the continuous test fault current.

In one embodiment, the ground fault circuit interrupter further includes an integrated circuit that is configured and disposed to receive power one of (a) across the load side of the phase conductor and the line side of the neutral conductor, and (b) across the line side of the phase conductor and the load side of the neutral conductor, respectively. The integrated circuit is energized by a quiescent current thereby, and the current imbalance is established by the quiescent current. The current transformer is configured and disposed to detect the quiescent current as the continuous test current. The ground fault circuit interrupter may further include a rectifier electrically coupled to the integrated circuit, wherein the quiescent current is established by the rectifier being electrically coupled via a conductor one of (a) between the line side of the phase conductor and the load side of the neutral conductor; and (b) between the load side of the phase conductor and the line side of the neutral conductor. The current transformer may be configured to detect the current imbalance, and the integrated circuit may be configured and disposed to initiate a trip signal to decouple at least one of (1) the load side of the phase conductor from the line side of the phase conductor and (2) the load side of the neutral conductor from the line side of the neutral conductor, said trip signal being initiated by the integrated circuit if the current imbalance detected by the current transformer is greater than the sum of a predetermined magnitude and the continuous test fault current.

The present disclosure relates also to a method of at least partially continuously testing a circuit interrupter that includes the steps of: providing a ground fault circuit interrupter that includes: a current transformer; a phase conductor; and a neutral conductor, the phase and neutral conductors each having a line side and a load side, wherein the phase conductor and the neutral conductor are each configured to pass through the transformer from the line side to the load side, the line side and the load side of the phase and neutral conductors being defined by the current transformer; and establishing as a continuous test current a continuous current imbalance one of (a) between the load side of the phase conductor and the line side of the neutral conductor; and (b) between the line side of the phase conductor and the load side of the neutral conductor.

A corresponding analogous method of manufacturing a circuit interrupter characterized by the foregoing continuous at least partial testing features is also disclosed herein.

BRIEF DESCRIPTION OF THE DRAWINGS

Embodiments of the present disclosure are described herein with reference to the drawings in which similar elements are given similar reference characters, wherein.

DETAILED DESCRIPTION

Figure 1:
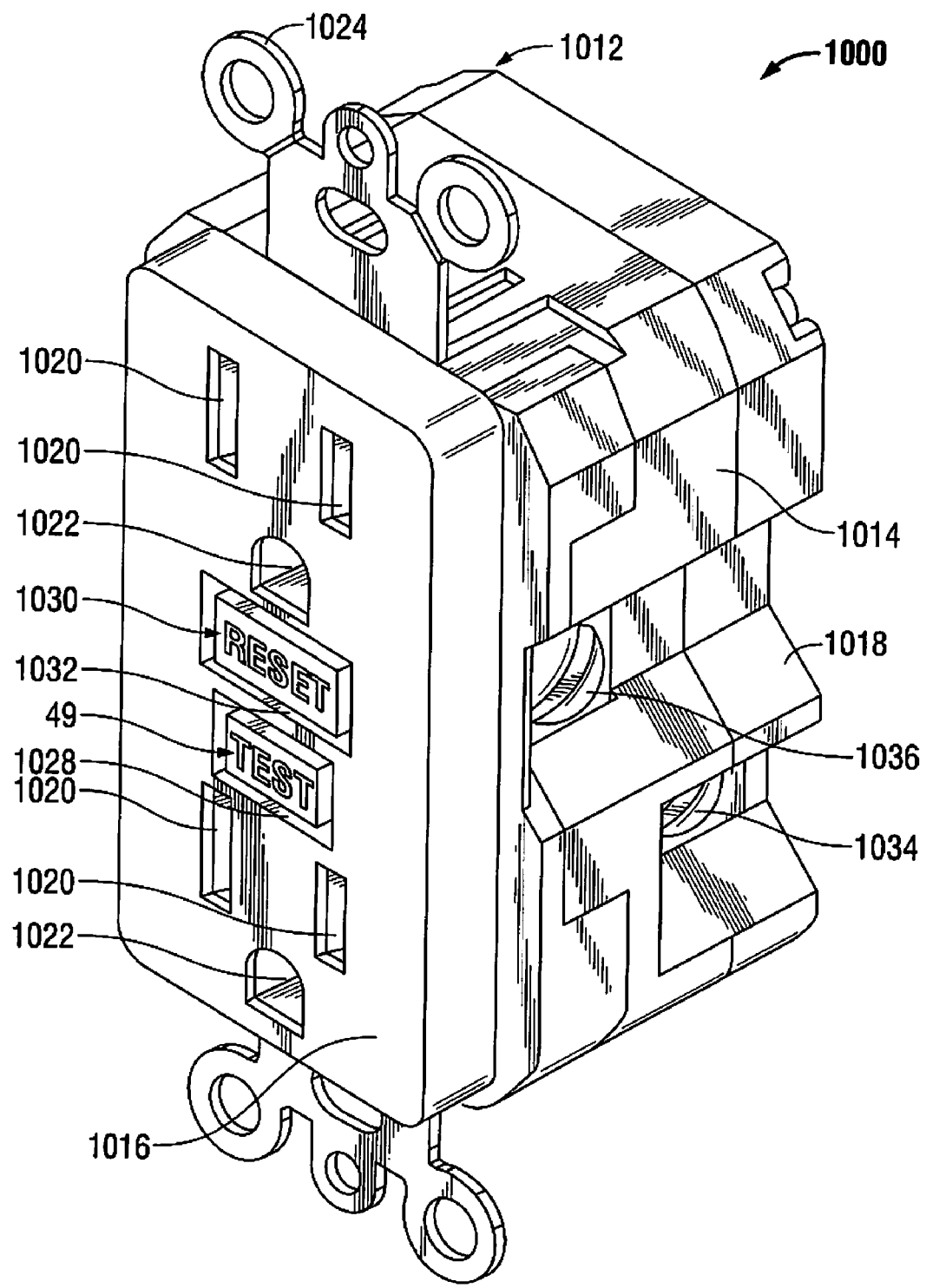
FIG. 1 is a perspective view of a ground fault circuit interrupting device according to the present application.

The present disclosure advances the state of the art of circuit interrupting devices and systems by disclosing a GFCI having at least one continuous self-testing feature wherein testing at least partial operation of the GFCI does not rely on the actions of a user to initiate the testing. As defined herein, continuous refers to self-testing that occurs indefinitely in time without interruption and also to self-testing that recurs in steady and usually rapid succession.

The continuous self-testing features according to the present disclosure shown in the drawings and described hereinbelow are incorporated in a GFCI receptacle suitable for installation in a single-gang junction box in a home. However, the continuous self-testing features according to the present disclosure can be included in any of the various devices in the family of resettable circuit interrupting devices, including ground fault circuit interrupters (GFCI's), arc fault circuit interrupters (AFCI's), immersion detection circuit interrupters (IDCI's), and appliance leakage circuit interrupters (ALCI's).

Turning now to FIG. 1, the GFCI receptacle 1000 has a housing that includes a relatively central body 1014 to which a face or cover portion 1016 and a rear portion 1018 are removably secured. The face portion 1016 has entry ports 1020 for receiving normal or polarized prongs of a male plug of the type normally found at the end of a lamp or appliance cord set (not shown), as well as ground-prong-receiving openings 1022 to accommodate a three-wire plug. The receptacle also includes a mounting strap 1024 used to fasten the receptacle to a junction box.

As explained in more detail below with respect to FIGS. 2 and 3, a manually-operated momentary test button or switch 49 extends through opening 1028 in the face portion 1016 of the housing 1012. Depression of the test button 49 activates a test cycle, thereby testing the operation of a circuit interrupter (or circuit interrupting mechanism) disposed in the device. The circuit interrupter, to be described in more detail below, is used to break electrical continuity between input and output conductive paths (or conductors). A reset button 1030 forming a part of a reset mechanism extends through opening 1032 in the face portion 1016 of the housing 1012. The reset button is used to activate a reset sequence or cycle, which reestablishes electrical continuity between the input and output conductive paths or conductors. Alternatively, the reset sequence or cycle may be reestablished mechanically.

Electrical connections to existing household electrical wiring are made via binding screws 1034 and 1036, where screw 1034 is an input (or line) connection point and screw 1036 is an output (or load) connection point. It should be noted that two additional binding screws (not shown) are located on the opposite side of the receptacle 1000. Similar to binding screws 1034 and 1036, these additional binding screws provide input and output connection points. Further, the input connections are for line side phase (hot) and neutral conductors of the household wiring, and the output connections are for load side phase (hot) and neutral conductors of the household wiring. The plug connections are also considered output conductors. A more detailed description of a GFCI receptacle is provided in U.S. Pat. No. 4,595,894, which is incorporated herein in its entirety by reference.

A GFCI receptacle such as GFCI receptacle 1000 commonly is configured with an electronic circuit that detects a ground fault. Such an electronic circuit is provided electrical power from the line side of the GFCI. Generally, the line voltage, e.g., 120 volts alternating current (VAC), is supplied to a full wave bridge rectifier to transform the line voltage AC power to a low voltage direct current (DC) signal. The electronic circuit receives the DC signal to sense one or more signals emitted by one or more current transformers electrically coupled to the electronic circuit. When the GFCI is receiving power from the line side and is in a reset state, the GFCI may provide power to a load electrically coupled on the load side.

Even if no power is being drawn by a load, if the GFCI is receiving power from the line side, the electronic circuit, which may include an integrated circuit chip, still draws a certain amount of current. Even though this current may be quite small, and is referred to as the quiescent current, this quiescent current is still present and measurable. As discussed in detail below, this quiescent current may be harnessed to provide one embodiment of a GFCI that has a continuous self-testing feature.

Figure 2:
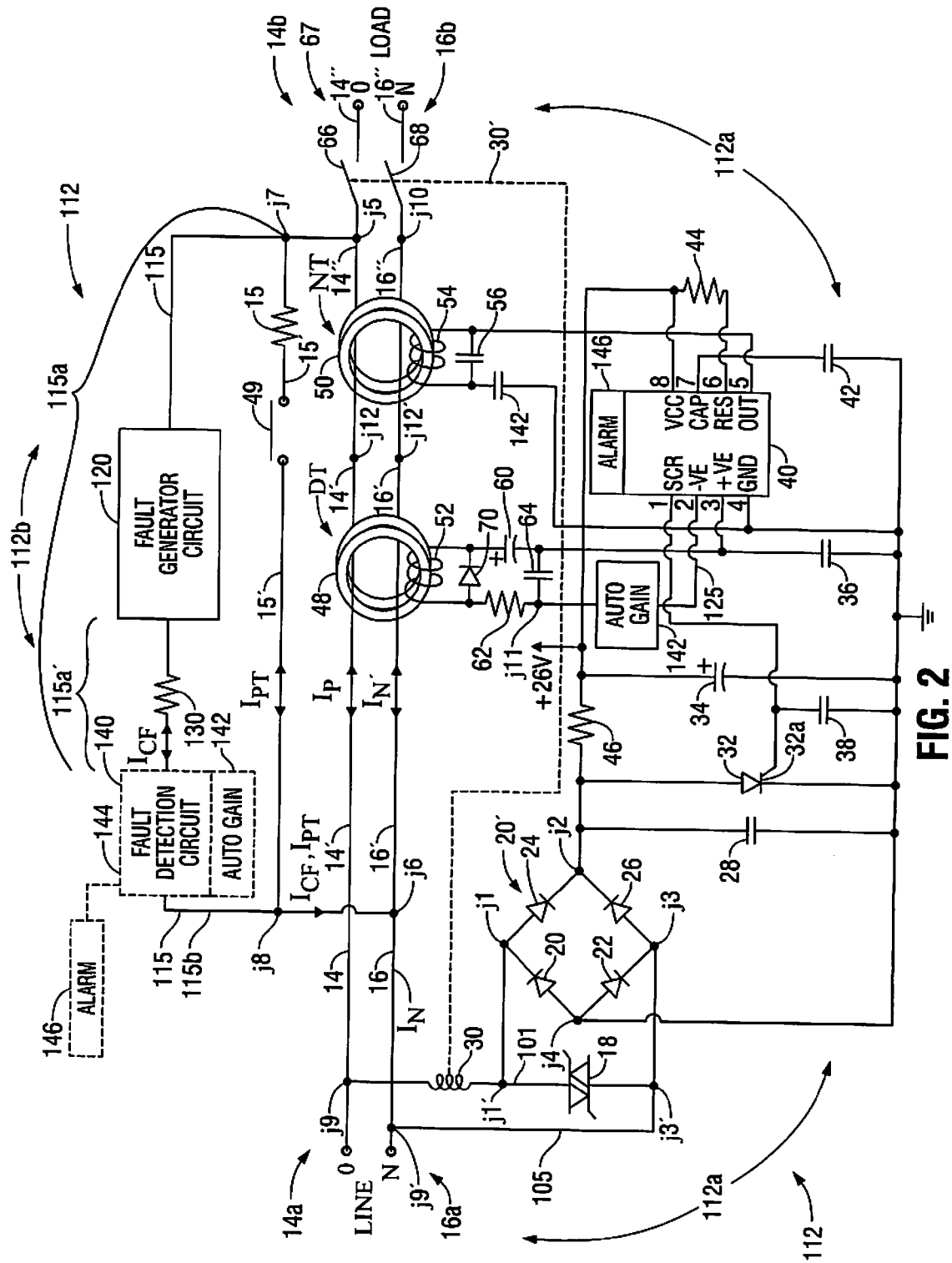
FIG. 2 is a schematic diagram of a circuit for detecting ground faults and continuously testing at least partial operation of the GFCI device of FIG. 1 according to one embodiment of the present disclosure.

In view thereof, a schematic diagram illustrating a ground fault circuit interrupter device 112 having a continuous self-testing feature according to a first embodiment of the present disclosure is shown in FIG. 2. More particularly, GFCI 112 includes a circuit interrupting actuation circuit 112a and a fault current test circuit 112b that is disposed and electrically coupled to the circuit interrupting actuation circuit 112a to test at least partially the operability of the circuit interrupting actuation circuit 112a.

As is explained in more detail below, the fault current test circuit 112b is disposed and configured to receive power from a power source, e.g., from line phase and line neutral. The circuit interrupting actuation circuit 112a of GFCI 112 receives power from line phase and line neutral via the full wave bridge rectifier as is known in the art. However, as is explained in more detail below, fault current test circuit 112b of GFCI 112 includes a continuous test conductor or line that bypasses the periodic test conductor or line. The fault current test circuit 112b continuously tests at least partially the operability of the circuit interrupting circuit 112a of the GFCI 112.

The circuit interrupting actuation circuit 112a of GFCI 112 includes a first current transformer or differential transformer DT that includes a magnetic core 48 around which is wound a coil 52 that is in electrical communication or electrically coupled to an integrated circuit 40. GFCI 112 also includes a second current transformer or neutral transformer NT that includes a magnetic core 50 around which is wound a coil 54 that also is in electrical communication or electrically coupled to integrated circuit 40. Integrated circuit (IC) 40 may include a ground fault interrupter Model No. LM1851 manufactured by National Semiconductor Corporation (Santa Clara, Calif., USA), as shown in the exemplary embodiments of FIGS. 2 and 3, or integrated circuit 40 may include another suitable ground fault interrupter.

A first or phase conductor 14, having a line side 14' with a line end 14a and a load side 14" with a load end 14b and a second or neutral conductor 16, having a line side 16' with a line end 16a and a load side 16" with a load end 16b, are electrically coupled to the first or differential transformer DT and to the second or neutral transformer NT by passing therethrough to induce an electrical signal if the currents flowing through the phase and neutral conductors are not equal, i.e., there is a current imbalance. More particularly, the phase conductor 14 and the neutral conductor 16 are each configured to pass through the transformers DT and NT from the line sides 14', 16' to the load sides 14", 16", respectively. As explained in more detail below, the line sides 14', 16' and the load sides 14", 16" are defined by the differential transformer DT and the neutral transformer NT.

A full wave bridge rectifier 20' is electrically coupled to the first or differential transformer DT and to the second or neutral transformer NT via the phase conductor 14 at the line end 14a and via the neutral conductor 16 at the line end 16a. The full wave bridge rectifier 20' is formed from diodes 20, 22, 24, 26.

A relay coil 30 is electrically coupled to the phase conductor 14 at the line end 14a and to junction j1 of the full wave bridge rectifier 20'. The AC power from the phase 14 and neutral 16 conductors is full wave rectified via the full wave rectifier 20'. The full wave rectifier 20' transforms the line voltage AC power to a low voltage DC signal which may be 26 volts as explained below.

A metal oxide varistor (MOV) 18 is placed across phase 16 and neutral 14 for protection from external voltage spikes. More particularly, the MOV 18 is electrically coupled across junction j1 and junction j3 and to the phase conductor 14 on the line end 14a via the relay coil 30 at junction j1'. The output of the bridge 20' is electrically coupled from junction j2 and from junction j4 across capacitor 28 and also across silicon controlled rectifier (SCR) 32. The gate 32a of the SCR 32 is coupled to ground via capacitor 38 and to pin 1 of IC 40. The output of the bridge 20' is electrically coupled from the junction j3 to a common junction j3'. From junction j3', the output of the bridge 20' is electrically coupled through the MOV 18 in conductor 101 to junction j1' to relay coil 30 to the line side phase conductor 14' at junction j9. Also from junction j3', the output of the bridge 20' is electrically coupled at junction j9' to the neutral conductor 16 at the line end 16a via a conductor 105.

A diode 70 and capacitor 64 are electrically coupled in parallel across the coil 52 of the differential transformer DT. The coil 52 is coupled to pin 2 of IC 40 via resistor 62 and to pin 3 of IC 40 via capacitor 60. Pin 3 is also coupled to ground via capacitor 36.

A capacitor 56 is electrically coupled across coil 54 of the neutral transformer NT. Coil 54 is coupled to pin 4 of IC 40 via capacitor 58. Pin 4 is also coupled to ground. Coil 54 is also coupled to pin 5 of IC 40. Pin 6 of IC 40 is coupled to pin 8 via resistor 44 and pin 7 is coupled to ground via capacitor 42. Pin 8 is also coupled to junction j2 of the full wave rectifier 20' via resistor 46. Pin 8 is also coupled to ground via capacitor 34. A voltage potential on pin 8 serves as the supply voltage for the GFCI circuitry, i.e., IC 40 and the abovementioned circuitry and circuitry described below, and in the example shown, the voltage potential is 26 Volts. The ground fault circuit interrupter integrated circuit detector 40 draws a quiescent current from the line side 14a of the phase conductor 14. Thus, IC 40 receives electrical power from the bridge rectifier 20' that in turn receives power from the line phase conductor 14' and the line neutral conductor 16'.

As mentioned above, the first or phase conductor 14 includes a line side 14' and a load side 14". Similarly, the second or neutral conductor 16 includes a line side 16' and a load side 16".

Each of line sides 14' and 16' of the phase and neutral electrical conductors 14 and 16, respectively pass through the transformers DT and NT and electrically couple with the load sides 14" and 16" of the phase and neutral conductors 14 and 16, respectively, via a double pole relay 67. A phase current IP is established in the phase conductor 14 and a neutral current IN is established in the neutral conductor 16. The double pole relay 67 includes switches 66, 68, associated with the load side 14b of phase conductor 14 and load side 16b of neutral conductor 16, respectively, and function to open the phase conductor 14 and the neutral conductor 16 at the load sides 14b and 16b, respectively, to decouple the load from the line in the event a ground fault is detected.

The coil 30 is electrically coupled via conductor line 30' (dashed line) to the switches 66, 68 of relay 67. Coil 30 is energized when the GFCI circuitry turns on the silicon controlled rectifier (SCR) 32 via emission of a signal S (not shown) from the IC 40 through Pin 1, thereby signaling the switches 66, 68 to transfer to the open position. The phase conductor 14 and the neutral conductor 16 are each configured and disposed through the first current transformer or differential transformer DT and with respect to the second current transformer or neutral transformer NT to induce a fault trip signal following occurrence of: (a) a difference in current flowing in the phase conductor 14 and the neutral conductor 16 of the conductive path passing through the first current transformer DT; and/or (b) flow of a current from the neutral conductor 16 to ground passing through the second current transformer NT.

In addition, the ground fault interrupter integrated circuit detector 40 is configured and operatively coupled to the first and second current transformers, DT and NT, respectively, to detect: (a) a difference in current flowing in the phase conductor 14 and the neutral conductor 16 of the conductive path passing through the first current transformer; and/or (b) flow of a current from the neutral conductor 16 to ground passing through the second current transformer NT.

GFCI 112 may include a periodic test circuit that includes, as described above, momentary push button switch 49 electrically coupled in series with a periodic test resistor 15, that electrically couples via a periodic test conductor 15' the load side 14" of phase conductor 14 at junction j5 to the line side 16' of neutral conductor 16 at junction j6. When the switch 49 is pressed, a temporary simulated ground fault, i.e., a temporary differential current path in the periodic test conductor 15' represented by a periodic test current IPT, from the load side 14" of phase conductor 14 to the line side 16' of neutral conductor 16 is created in order to test the operation of the GFCI 112.

In accordance with the embodiments of the present disclosure, GFCI 112 includes the fault current test circuit 112b wherein a continuous fault conductor 115 is operatively coupled to the line side 16' of the neutral conductor 16, in one embodiment by being electrically coupled to the periodic test conductor 15' at junction j7, and to the load side 14" of the phase conductor 14, in one embodiment by being electrically coupled to the periodic test conductor 15' at junction j8, thereby bypassing the momentary push button switch 49 and the periodic test resistor 15.

The continuous fault conductor 115 includes a fault generator circuit 120 electrically coupled therein in a first segment 115a between junction j7 and a continuous fault detection circuit 140, shown by dashed lines, in electrical communication with the continuous fault conductor 115. The continuous fault conductor 115 further includes an impedance or impedance load 130 that is electrically coupled therein and is disposed in electrical communication between the fault generator circuit 120 and the fault detection circuit 140. As defined herein, an impedance load as shown in FIG. 2 is a resistive load represented by a resistor 130 as shown but may include an inductive load represented by an induction coil and/or a capacitive load represented by a capacitor.

The fault generator circuit 120 is configured to generate a continuous fault signal, represented by a current ICF in the continuous fault conductor 115 in the first segment 115a. A second segment 115b of the fault conductor 115 provides electrical communication between the continuous fault detection circuit 140 and junction j8. The impedance load 130 is configured wherein the magnitude of the continuous test current ICF is proportional to the magnitude of the impedance load 130.

Thus GFCI 112, via the fault current test circuit 112b, is configured to generate a continuous test current ICF by a continuous current imbalance ΔIPN (not shown) being established between the line side of the neutral conductor, e.g., junction j6 on the line side 16' of the line conductor 16, and the load side of the phase conductor, e.g., junction j5 on the load side 14" of the phase conductor 14. When the fault current test circuit 112b is receiving power from the power source, the fault current test circuit 112b continuously tests at least partially the operability of the circuit interrupting circuit 112a via the fault current test circuit 112b being disposed and electrically coupled to allow passage of the continuous test current ICF by the continuous current imbalance ΔIPN. The continuous current imbalance ΔIPN arises from the difference between the phase current IP flowing in the phase conductor 14 that is detected by the differential transformer DT and the neutral current IN' flowing in the neutral conductor 16 that is detected by the differential transformer DT. The magnitude of the neutral current IN' differs from the magnitude of neutral current IN in the line side 16' of the neutral conductor 16 that is not detected by the differential transformer DT and from the magnitude of phase current IP flowing in the phase conductor 14 that is detected by the differential transformer DT, the magnitude of the latter two currents IN and IP being equal.

Although not illustrated in FIG. 2, GFCI 112 may also be configured to generate a continuous test current ICF by a continuous current imbalance ΔIPN being established between the line side of the phase conductor, e.g., junction j9 on the line side 14' of the phase conductor 14, and the load side of the neutral conductor, e.g., junction j10 on the load side 16" of the neutral conductor 16.

As described above, the load sides 14" and 16" of the phase and neutral conductors 14 and 16 are defined by, or begin at, the load side of DT. Thus, the load side of DT begins generally at junctions j12 and j12' on the phase conductor 14 and the neutral conductor 16, respectively, between DT and NT. Since NT remains in the circuit of GFCI 112, but is not configured to detect the continuous test fault current ICF, the load sides 14" and 16" are shown to begin, respectively, near junctions j5 and j10 on the load side of NT. However, junctions j12 and j12' may also be connection points for the continuous test conductor 115 on the load side of the DT.

As described below, the fault detection circuit 140 may also be incorporated into the IC 40 or IC 40 may be modified or adjusted to perform the functions of the fault detection circuit 140.

In one embodiment, the fault generator circuit 120 includes a silicon controlled rectifier (SCR) and/or a metal oxide semiconductor field effect transistor (MOSFET) to generate the continuous fault signal current ICF.

In the exemplary embodiment of GFCI 112 illustrated in FIG. 2, the continuous fault signal current ICF is characterized by an alternating current. Thus, the continuous fault signal current ICF oscillates with the single phase line current IP and the neutral current IN.

In one embodiment, GFCI 112 is configured wherein the continuous fault signal (current ICF) is established as a predetermined threshold current. If the difference ΔIPN (not shown) between the absolute value of maximum current IPmax flowing in the phase conductor 14 and the absolute value of maximum current IN'max flowing in the neutral conductor 16 of the conductive path passing through the first current transformer DT (i.e. a ground fault), DT thus detects the difference ΔIPN. Since the IC 40 is electrically coupled to the DT, the IC 40 is thus configured to detect the continuous test fault current ICF via the DT. IC 40 may be configured to calculate the root mean square (RMS) of the phase current IP and the neutral current IN.

As mentioned above, the currents IP and IN may be detected by the separate fault detection circuit 140 wherein fault detection circuit 140 calculates the difference ΔIPN between the absolute value of maximum current |IPmax| flowing in the phase conductor 14 and the absolute value of maximum current |IN'max| flowing in the neutral conductor 16 and compares difference ΔIPN to the predetermined threshold current ICF. If ΔIPN is greater than ICF, fault detection circuit 140 electrically communicates the information to IC 40, and in particular to Pin 2 in conductor 125. If the ΔIPN (equal to the value of |IPmax|−|IN'max|) exceeds the predetermined threshold current, i.e., ΔIPN is greater than ICF. IC 40 then initiates or generates the actual fault trip signal S to trip double pole relay 67 via the relay coil 30 and the conductor 30' that is electrically coupled to the relay 67. In a similar manner as with respect to IC 40, the fault detection circuit 140 may be configured to initiate the fault trip signal S based on the root-mean-square (RMS) values of ΔIPN or of the phase current IP and of the neutral current IN.

Thus, IC 40 is configured to initiate trip signal S to decouple at least one of (1) the load side 14" of the phase conductor 14 from the line side 14' of the phase conductor 14, and (2) the load side 16" of the neutral conductor 16 from the line side 16' of the neutral conductor 16 if the current imbalance ΔIPN detected by the current transformer DT is greater than the sum of a predetermined magnitude and the continuous test fault current ICF.

In one embodiment, GFCI 112 includes an autogain circuit 142 that is electrically coupled in coil 52 between the differential transformer DT and IC 40, and particularly in conductor 125 between junction j11 and Pin 2 (dedicated to-VE) of IC 40. The autogain circuit 142 continuously compensates or substantially nulls the continuous fault current ICF to zero, such that IC 40 detects no external ground fault due to the continuous fault current ICF. In this embodiment, the trip signal setpoint configuration of IC 40 as provided by the supplier is substantially unchanged.

In one embodiment (not shown), separate fault detection circuit 140 is omitted from the test conductor line 115 and IC 40 performs the detection and calculation steps described above. In such an embodiment, those skilled in the art will recognize that IC 40 as provided by the supplier is modified to establish the continuous fault signal current ICF as the predetermined threshold current.

It should be noted for the foregoing embodiments of GFCI 112 that although the second or neutral transformer NT does not contribute to the establishment of the continuous fault signal current ICF, the neutral transformer NT remains available to initiate detection of flow of a current from the neutral conductor 16 to ground passing through the second or neutral current transformer NT without modification of IC 40 with respect to detection of a neutral to ground fault and initiation of a trip signal thereupon of double pole relay 67, There is no change necessarily required to the predetermined threshold current already established within IC 40 to detect a neutral to ground fault.

In one embodiment, as illustrated by the dotted lines, the GFCI 112 includes the autogain controller 142 being electrically coupled in the second conductor segment 115b to IC 40 and in particular to Pin 2 in conductor 125. The autogain circuit 142 may be configured to substantially null in the second segment 115b the continuous fault signal current ICF occurring in the first segment 115a. In one embodiment, the current detection circuit 140 and the autogain circuit 142 are configured as an integrated current detection circuit and autogain circuit 144. The current detection circuit 140 or the integrated current detection circuit and autogain circuit 144 may be electrically coupled to an alarm 146 that triggers upon failure of the circuits 140 or 144 in continuous test conductor 115 to detect the continuous fault signal current ICF.

When the current detection circuit 140 and the autogain circuit 142 are configured as an integrated current detection circuit and autogain circuit 144, since there is a continuous fault signal 130 (represented by a fault current ICF) between the fault generator circuit 120 and the continuous fault detection circuit 140, the autogain circuit 142 reduces the continuous fault current ICF to 0 in the second conductor portion 115b.

Figure 3:
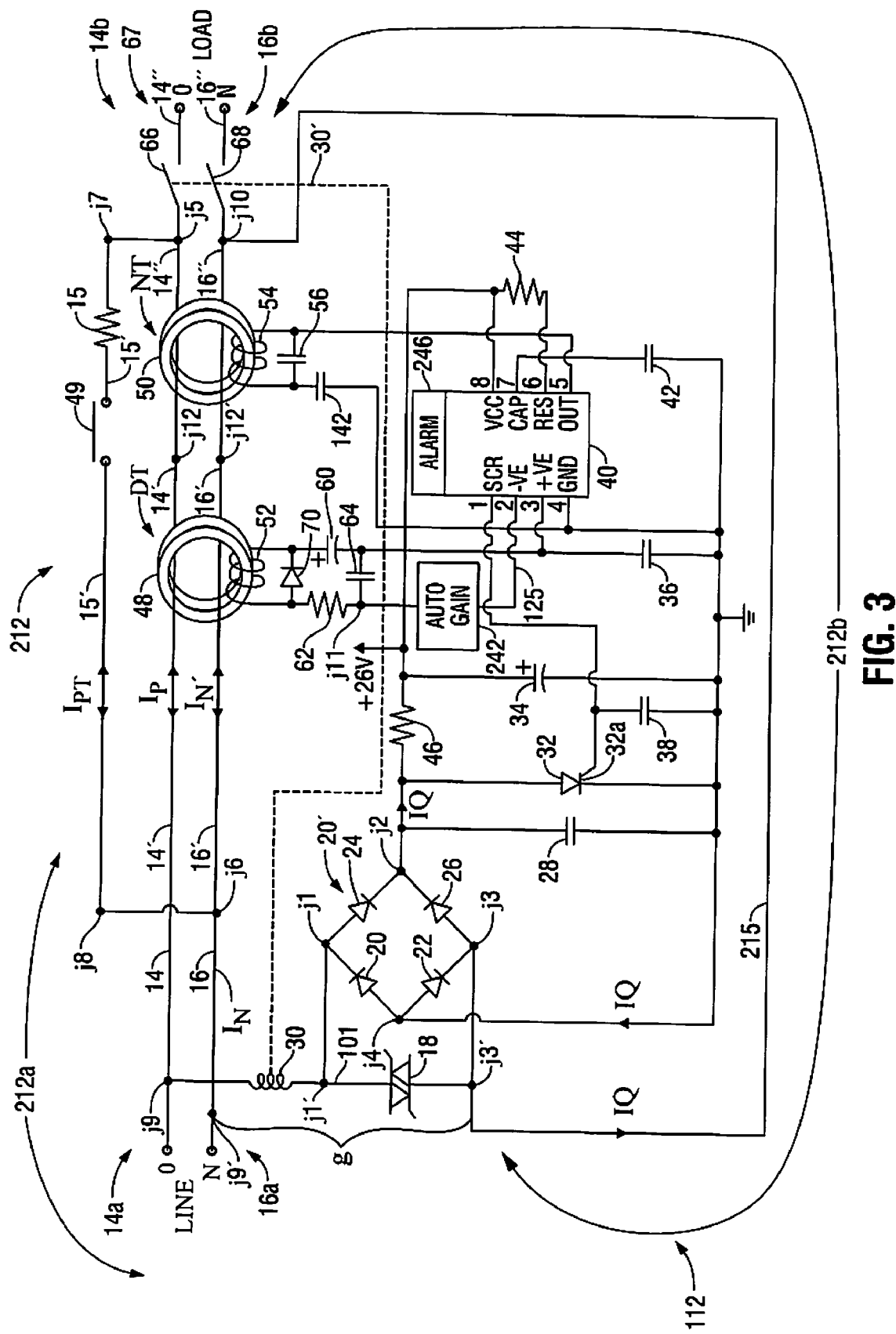
FIG. 3 is a schematic diagram of a circuit for detecting ground faults and continuously testing at least partial operation of the GFCI device of FIG. 1 according to another embodiment of the present disclosure.

FIG. 3 illustrates a schematic diagram of a ground fault circuit interrupter device GFCI 212 having a continuous self-testing or test/line conductor feature according to a second embodiment of the present disclosure. More particularly, GFCI 212 is configured to take advantage of the quiescent current of the GFCI integrated circuit to provide a continuous self-testing feature. Rather than the integrated circuit of GFCI 212 receiving power from line phase and line neutral via the full wave bridge rectifier, GFCI 212 instead receives power in a manner which bypasses the differential transformer and thus a current imbalance is created. To bypass the differential transformer, the rectifier may be connected from line phase to load neutral or from load phase to line neutral. In either case, a standing current imbalance is created which can be detected by the differential transformer. The integrated circuit then accounts for this current imbalance or standing leakage by setting the current imbalance as a predetermined threshold such that an actual current detected by the differential transformer that exceeds the current imbalance is recognized as a fault trip signal by the integrated circuit.

For simplicity, only differences between GFCI 212 illustrated in FIG. 3 and GFCI 112 described above in FIG. 2 are discussed in detail as necessary to explain the configuration, design and operation of GFCI 212. More particularly, in a generally similar manner as with respect to GFCI 112, GFCI 212 includes a circuit interrupting actuation circuit 212a and a fault current test circuit 212b that is disposed and electrically coupled to the circuit interrupting actuation circuit 212a to test at least partially the operability of the circuit interrupting actuation circuit 212a. As is again explained below in more detail, the fault current test circuit 212b is disposed and configured to receive power from a power source, e.g., from line phase and line neutral. The fault current test circuit 212b continuously tests at least partially the operability of the circuit interrupting circuit 212a of the GFCI 212.

In additional detail, GFCI 212 differs from GFCI 112 in that conductor 105 electrically coupling junction j3' is disconnected from junction j9' on the line side neutral conductor 16', forming a gap g between junction j3' and junction j9'. The fault current test circuit 212b includes a continuous test conductor 215 that electrically couples the rectifier 20', of the circuit interrupting actuation circuit 212a, from junction j3' to junction j10 in the load side neutral conductor 16''. Therefore, the continuous test conductor 215 of fault current test circuit 212b is configured and electrically coupled with respect to the first current transformer DT to bypass the first current transformer DT of the circuit interrupting actuation circuit 212a.

The connection of the continuous test conductor 215 of the fault current test circuit 212b thereby draws the quiescent current of the integrated circuit 40 of the circuit interrupting actuation circuit 212a to create an artificial ground or fault current as follows. Quiescent current IQ drawn by the ground fault interrupter integrated circuit detector 40 flows from junction j2 of the bridge rectifier 20' to Pin 8 VCC and to Pin 6 RES of IC 40. Quiescent current IQ flows from Pin 7 CAP of IC 40 to junction j4 of the bridge rectifier 20'. Quiescent current IQ flows also from junction j3 to junction j3' through the continuous test conductor 215 to the load side neutral conductor 16'' at junction j10.

Therefore, in a similar manner as described above with respect to GFCI 112, circuit interrupting actuation circuit 212a of GFCI 212 includes IC 40 as being configured and disposed to receive power either across the load side 14'' of the phase conductor 14 and the line side 16' of the neutral conductor 16, or as shown in FIG. 3, across the line side 14' of the phase conductor 14 and the load side 16'' of the neutral conductor 16, respectively, the integrated circuit IC 40 thereby being energized by the quiescent current IQ.

IC 40 now detects the quiescent current IQ as a continuous fault signal current. IC 40 detects and measures the current IQ in a similar manner as with respect to GFCI 112 described above. That is, IC 40 detects and measures the current IQ as the difference ΔIPN (not shown in FIG. 2 or FIG. 3) between the absolute value of current IP flowing in the phase conductor 14 and the absolute value of current IN flowing in the neutral conductor 16 of the conductive path passing through the first current transformer DT (i.e. a ground fault). Again, DT induces the IC 40 to generate the actual fault trip signal S if the ΔIPN (equal to the value of |PI|−|IN|) exceeds the predetermined threshold current, i.e., ΔIPN is greater than IQ.

Thus, the current imbalance is established by the quiescent current IQ. The current transformer DT is configured and disposed to detect the quiescent current IQ as the continuous test current.

In a similar manner as explained above with respect to GFCI 112, in one embodiment, GFCI 212 includes autogain circuit 242 that is electrically coupled in coil 52 between the differential transformer DT and IC 40, and particularly in conductor 125 between junction j11 and Pin 2 (dedicated to-VE) of IC 40. The autogain circuit 242 continuously compensates the continuous fault current ICF to zero, such that IC 40 detects no external ground fault. In a similar manner as described above with respect to GFCI 112, in this embodiment, the trip signal setpoint configuration of IC 40 as provided by the supplier is substantially unchanged.

As illustrated in FIG. 3, the rectifier 20' receives power by being connected across line phase 14' and load neutral 16". The rectifier 20' is also electrically coupled to the IC 40. Those skilled in the art will recognize that, in an alternative embodiment, the rectifier 20' may receive power by being connected across line neutral 16' and load phase 14" to achieve a similar result of creating a continuous fault current. More particularly, in such an embodiment, the connection between junction j3' and junction j9' is restored on line neutral 16'. The connections at junctions j9 and j10 are disconnected. The rectifier 20' may receive power by being connected at junction j9' at line neutral 16' and transferring the connection of junction j9 from load neutral 14' to load phase 14". For either embodiment, a standing current imbalance is generally present and is detected by the differential transformer DT. The electronics of the GFCI 112 or 212, e.g., IC 40, must then account for this standing leakage.

Therefore, the quiescent current IQ is established by the rectifier 20' being electrically coupled via the conductor 215 being coupled between the line side 14' of the phase conductor 14 and the load side 16" of the neutral conductor 16, as illustrated in FIG. 3, or between the load side 14" of the phase conductor 14 and the line side 16' of the neutral conductor 16. Junction j5 may be an alternate connection when the continuous test conductor 215 is connected from the load side 14" of the phase conductor 14 to the line side 16' of the neutral conductor 16 (i.e., junction j9' is restored and junction j9 is transferred to junction j5). Thus, in a similar manner as with respect to GFCI 112, when the fault current test circuit 212b is receiving power from the power source, e.g., line sides 14', 16', the fault current test circuit 212b continuously tests at least partially the operability of the circuit interrupting circuit 212a via the fault current test circuit 212b being disposed and electrically coupled to allow passage of the continuous test current by the continuous current imbalance, e.g., quiescent current IQ.

In a similar manner as described above with respect to GFCI 112, the load sides 14" and 16" of the phase and neutral conductors 14 and 16 are defined by, or begin at, the load side of DT. Thus, the load side of DT begins at junctions 12 and 12' on the phase conductor 14 and the neutral conductor 16, respectively, between DT and NT. Since NT remains in the circuit of GFCI 212, but is not configured to detect the continuous test fault current IQ, the load sides 14" and 16" are shown to begin near junctions j5 and j10 on the load side of NT. However, junctions j12 and j12' may also be connection points for the continuous test conductor 215 on the load side of the DT.

In a similar manner as described above with respect to GFCI 112, if there is a difference ΔIPN (not shown) between the absolute value of current IP flowing in the phase conductor 14 and the absolute value of current IN flowing in the neutral conductor 16 of the conductive path passing through the first current transformer DT (i.e. a ground fault), DT induces the IC 40 to generate the actual fault trip signal S if the ΔIPN (equal to the value of |IP|−|IN|) exceeds the predetermined threshold current as set per industry standards. For example, a ground fault external to the GFCI 212 may be present and be of a certain magnitude. The magnitude of the external ground fault added to the magnitude of the quiescent current IQ may then be referenced as the level at which the GFCI 212 initiates the trip signal S.

That is, the current or differential transformer DT is configured to detect the current imbalance as ΔIPN. The integrated circuit IC 40 is configured and disposed to initiate a trip signal S to decouple at least one of (1) the load side 14" of the phase conductor 14 from the line side 14' of the phase conductor 14 and (2) the load side 16" of the neutral conductor 16 from the line side 16' of the neutral conductor 16. The trip signal S is initiated by the integrated circuit IC 40 if the current imbalance ΔIPN detected by the current or differential transformer DT is greater than the sum of a predetermined magnitude and the continuous test fault current, as represented by the quiescent current IQ.

In a similar manner as described above with respect to GFCI 112, an actual trip signal S can also be generated by IC 40 detecting flow of a current from the neutral conductor to ground ING passing through the second or neutral current transformer NT, wherein ING is greater than the threshold current, again in this case, the quiescent current IQ plus a predetermined magnitude. Again, the quiescent current IQ=|IP|−|IN|.

In one embodiment, IC 40 and the autogain circuit 242 are configured as an integrated current detection circuit and autogain circuit 244 (with dashed lead line). In a similar manner as with respect to GFCI 112, the IC 40 or the integrated current detection circuit and autogain circuit 244 may be electrically coupled to an alarm 246 that triggers upon failure of IC 40 or circuit 244 to detect the continuous fault or quiescent current IQ in continuous test conductor 215.

As can be appreciated from the aforementioned disclosure, referring to FIGS. 2 and 3, the present disclosure relates also to a corresponding method of at least partially continuously testing a circuit interrupter, e.g., a ground fault circuit interrupter such as GFCI 112 or 212, that includes the steps of: providing a current interrupter, e.g., GFCI 112 or 212, coupling electrical power to the circuit interrupter, e.g., GFCI 112 or 212, and continuously at least partially testing operability of the circuit interrupter, e.g., GFCI 112 or 212. The circuit interrupting actuation circuit 212a includes the following: a current transformer, e.g., differential transformer DT, phase conductor 14, and neutral conductor 16. The phase and neutral conductors 14, 16 each have line side 14', 16' and load side 14", 16", respectively. The phase conductor 14 and the neutral conductor 16 are each configured to pass through the transformer DT from the line side 14', 16' to the load side 14", 16", the line side 14', 16' and the load side 14", 16" of the phase and neutral conductors 14, 16, respectively being defined by the current transformer DT. The method also includes the step of establishing as a continuous test current, e.g., continuous test fault current ICF (see FIG. 2) or quiescent current IQ (see FIG. 3) a continuous current imbalance either between the load side 14" of the phase conductor 14 and the line side 16' of the neutral conductor 16, or between the line side 14' of the phase conductor 14 and the load side 16" of the neutral conductor 16.

Those skilled in the art will recognize that, and understand how, additional corresponding analogous method steps can be derived from the aforementioned disclosure with respect to GFCI 112 and 212 described in FIGS. 2 and 3, respectively. The analogous method steps include a method of manufacturing a circuit interrupter that includes the steps of configuring the circuit interrupter, e.g., GFCI 112 or 212, to receive electrical power from a power source, e.g., line side 14', 16', and configuring the circuit interrupter with circuitry, e.g., fault current test circuit 112a or 212a, to enable continuously at least partial testing of the circuit interrupter when electrical power is received by the circuit interrupter.

As can be appreciated also from the aforementioned disclosure, GFCI 112, 212 each have at least one continuous self-testing feature, e.g., continuous test conductors 115, 215, respectively, wherein testing at least partial operation of the GFCI 112, 212 does not rely on the actions of a user to initiate the testing, thereby increasing the reliability of testing of the operability of the GFCI 112, 212.

Those skilled in the art will recognize that although the foregoing description has been directed to a ground fault circuit interrupter, the disclosure may also relate to other circuit interrupters, including arc fault circuit interrupters (ACFI), immersion detection circuit interrupters (IDCI), appliance leakage circuit interrupters (ALCI), circuit breakers, contactors, latching relays, and solenoid mechanisms.

Although the present disclosure has been described in accordance with the embodiments shown, one of ordinary skill in the art will readily recognize that there could be variations to the embodiments and these variations would be within the spirit and scope of the present disclosure. Accordingly, many modifications may be made by one of ordinary skill in the art without departing from the spirit and scope of the appended claims.

What is claimed is:

1. A circuit interrupter comprising:
    a circuit interrupting actuation circuit; and
    a fault current test circuit disposed and electrically coupled to the circuit interrupting actuation circuit to test at least partially the operability of the circuit interrupting actuation circuit, the fault current test circuit disposed and configured to receive power from a power source,
    wherein when the fault current test circuit is receiving power from the power source, the fault current test circuit continuously generates a continuous test current for continuously testing at least partially the operability of the circuit interrupting circuit without user intervention.

2. The circuit interrupter according to claim 1,
    wherein the circuit interrupter is selected from the group consisting of a (a) a ground fault circuit interrupter (GFCI); (b) arc fault circuit interrupter (ACFI); (c) immersion detection circuit interrupter (IDCI); (d) appliance leakage circuit interrupter (ALCI); (e) circuit breaker; (f) contactor; (g) latching relay; and (h) solenoid mechanism.

3. The circuit interrupter according to claim 2,
    wherein the circuit interrupter is a ground fault circuit interrupter,
    wherein the circuit interrupting actuation circuit comprises:
        a current transformer;
        a phase conductor; and
        a neutral conductor,
    the phase and neutral conductors each having a line side and a load side,
    the phase conductor and the neutral conductor being each configured to pass through the transformer from the line side to the load side,
    the line side and the load side of the phase and neutral conductors being defined by the current transformer, and
    wherein when the fault current test circuit is receiving power from the power source, the fault current test circuit continuously tests at least partially the operability of the circuit interrupting circuit via the fault current test circuit being disposed and electrically coupled to allow passage of the continuous test current by a continuous current imbalance one of (a) between the load side of the phase conductor and the line side of the neutral conductor, and (b) between the line side of the phase conductor and the load side of the neutral conductor.

4. The circuit interrupter according to claim 1, wherein the circuit interrupter is a ground fault circuit interrupter, the ground fault circuit interrupter comprising:
    a current transformer,
    a phase conductor; and
    a neutral conductor,
    the phase conductor and the neutral conductor being each configured to pass through the transformer from the line side to the load side,
    the line side and the load side of the phase and neutral conductors being defined by the current transformer.

5. The circuit interrupter according to claim 3,
    wherein the ground fault circuit interrupter is configured to allow passage of the continuous test current by being configured to allow passage of the continuous current imbalance via a continuous test conductor electrically coupling one of (a) the load side of the phase conductor and the line side of the neutral conductor; and (b) the line side of the phase conductor and the load side of the neutral conductor, respectively,
    the ground fault circuit interrupter further comprising a fault generator circuit electrically coupled in the continuous test conductor and configured to generate the continuous test fault current therein.

6. The circuit interrupter according to claim 5, further comprising:
    an integrated circuit,
    wherein the current transformer is electrically coupled to the integrated circuit.

7. The circuit interrupter according to claim 6, wherein the integrated circuit is configured to detect the continuous test fault current.

8. The circuit interrupter according to claim 6, wherein the integrated circuit is configured to substantially null the continuous test fault current.

9. The circuit interrupter according to claim 7,
    wherein the current transformer is configured to detect the current imbalance; and
    wherein the integrated circuit is configured to initiate a trip signal to decouple at least one of (1) the load side of the phase conductor from the line side of the phase conductor, and (2) the load side of the neutral conductor from the line side of the neutral conductor, if the current imbalance detected by the current transformer is greater than the sum of a predetermined magnitude of the continuous test fault current.

10. A circuit interrupter comprising:
    a circuit interrupting actuation circuit;
    a fault current test circuit disposed and electrically coupled to the circuit interrupting actuation circuit to test at least partially the operability of the circuit interrupting actuation circuit, the fault current test circuit disposed and configured to receive power from a power source,
    wherein when the fault current test circuit is receiving power from the power source, the fault current test circuit continuously tests at least partially the operability of the circuit interrupting circuit without user intervention,
    wherein the circuit interrupter is selected from the group consisting of a (a) a ground fault circuit interrupter (GFCI); (b) arc fault circuit interrupter (ACFI); (c) immersion detection circuit interrupter (IDCI); (d) appliance leakage circuit interrupter (ALCI); (e) circuit breaker; (f) contactor; (g) latching relay; and (h) solenoid mechanism,
    wherein the circuit interrupting actuation circuit comprises:
        a current transformer;
        a phase conductor; and
        a neutral conductor, the phase and neutral conductors each having a line side and a load side, the phase conductor and the neutral conductor being each configured to pass through the transformer from the line side to the load side, the line side and the load side of the phase and neutral conductors being defined by the current transformer, and wherein when the fault current test circuit is receiving power from the power source, the fault current test circuit continuously tests at least partially the operability of the circuit interrupting circuit via the fault current test circuit being disposed and electrically coupled to allow passage of a continuous test current by a continuous current imbalance one of (a) between the load side of the phase conductor and the line side of the neutral conductor, and (b) between the line side of the phase conductor and the load side of the neutral conductor, wherein the circuit interrupter is configured to allow passage of the continuous test fault current by being configured to allow passage of the continuous current imbalance via a continuous test conductor electrically coupling one of (a) the load side of the phase conductor and the line side of the neutral conductor; and (b) the line side of the phase conductor and the load side of the neutral conductor, respectively, the circuit interrupter further comprising:

a fault generator circuit electrically coupled in the continuous test conductor and configured to generate the continuous test fault current therein, and an integrated circuit, wherein the current transformer is electrically coupled to the integrated circuit, wherein the integrated circuit is configured to detect the continuous test fault current, and an autogain circuit electrically coupled to the current transformer and to the integrated circuit, and wherein the autogain circuit is configured to substantially null the continuous test fault current detected by the integrated circuit.

11. The circuit interrupter according to claim 5, wherein the continuous test conductor further comprises an impedance load electrically coupled therein and configured wherein the magnitude of the continuous test current is proportional to the magnitude of the impedance load.

12. The circuit interrupter according to claim 11, wherein the impedance load is at least one of (a) a resistive load; (b) a capacitive load; and (c) an inductive load.

13. The circuit interrupter according to claim 11, wherein the continuous test conductor further comprises a fault detection circuit electrically coupled therein and configured to detect the continuous fault current.

14. The circuit interrupter according to claim 4, wherein the ground fault circuit interrupter further comprises:

an integrated circuit configured and disposed to receive power one of (a) across the load side of the phase conductor and the line side of the neutral conductor, and (b) across the line side of the phase conductor and the load side of the neutral conductor, respectively, said integrated circuit being energized by a quiescent current thereby, and wherein the current imbalance is established by the quiescent current, the current transformer being configured and disposed to detect the quiescent current as the continuous test current.

15. The circuit interrupter according to claim 14, wherein the ground fault circuit interrupter further comprises:

a rectifier electrically coupled to the integrated circuit, wherein the quiescent current is established by the rectifier being electrically coupled via a conductor one of (a) between the line side of the phase conductor and the load side of the neutral conductor; and (b) between the load side of the phase conductor and the line side of the neutral conductor.

16. The circuit interrupter according to claim 14, wherein the current transformer is configured to detect the current imbalance, and wherein the integrated circuit is configured and disposed to initiate a trip signal to decouple at least one of (1) the load side of the phase conductor from the line side of the phase conductor and (2) the load side of the neutral conductor from the line side of the neutral conductor, said trip signal being initiated by the integrated circuit if the current imbalance detected by the current transformer is greater than the sum of a predetermined magnitude and the continuous test fault current.

17. A circuit interrupter comprising:

a circuit interrupting actuation circuit; and a fault current test circuit disposed and electrically coupled to the circuit interrupting actuation circuit to test at least partially the operability of the circuit interrupting actuation circuit, the fault current test circuit disposed and configured to receive power from a power source, wherein when the fault current test circuit is receiving power from the power source, the fault current test circuit continuously tests at least partially the operability of the circuit interrupting circuit without user intervention, wherein the circuit interrupter is selected from the group consisting of a (a) a ground fault circuit interrupter (GFCI); (b) arc fault circuit interrupter (ACFI); (c) immersion detection circuit interrupter (IDCI); (d) appliance leakage circuit interrupter (ALCI); (e) circuit breaker; (f) contactor; (g) latching relay; and (h) solenoid mechanism, wherein the circuit interrupting actuation circuit comprises:

a current transformer;

a phase conductor; and a neutral conductor, the phase and neutral conductors each having a line side and a load side, the phase conductor and the neutral conductor being each configured to pass through the transformer from the line side to the load side, the line side and the load side of the phase and neutral conductors being defined by the current transformer, and wherein when the fault current test circuit is receiving power from the power source, the fault current test circuit continuously tests at least partially the operability of the circuit interrupting circuit via the fault current test circuit being disposed and electrically coupled to allow passage of a continuous test current by a continuous current imbalance one of (a) between the load side of the phase conductor and the line side of the neutral conductor, and (b) between the line side of the phase conductor and the load side of the neutral conductor, wherein the circuit interrupter further comprises:

an integrated circuit configured and disposed to receive power one of (a) across the load side of the phase conductor and the line side of the neutral conductor, and (b) across the line side of the phase conductor and the load side of the neutral conductor, respectively, said integrated circuit being energized by a quiescent current thereby, wherein the current imbalance is established by the quiescent current, the current transformer being configured and disposed to detect the quiescent current as the continuous test current, and an autogain controller electrically coupled to the integrated circuit wherein the autogain controller is configured to substantially null the current imbalance received as the quiescent current by the integrated circuit.

18. A method of testing a circuit interrupter comprising the steps of:
providing a circuit interrupter;
coupling electrical power to the circuit interrupter; and
continuously generating a test current for continuously at least partially testing operability of the circuit interrupter without user intervention.

19. The method of testing a circuit interrupter according to claim 18,
wherein the circuit interrupter comprises:
a circuit interrupting actuation circuit; and
a fault current test circuit disposed and electrically coupled to the circuit interrupting actuation circuit and configured to continuously generate the test current for continuously at least partially testing the operability of the circuit interrupting actuation circuit, and
wherein the steps of connecting electrical power to the circuit interrupter and continuously at least partially testing the operability of the circuit interrupter comprises:
connecting electrical power to the fault current test circuit; and
continuously at least partially testing the operability of the circuit interrupting actuation circuit.

20. The method of testing a circuit interrupter according to claim 18,
wherein the circuit interrupter is one of the group consisting of a (a) a ground fault circuit interrupter (GFCI); (b) arc fault circuit interrupter (ACFI); (c) immersion detection circuit interrupter (IDCI); (d) appliance leakage circuit interrupter (ALCI); (e) circuit breaker; (f) contactor; (g) latching relay; and (h) solenoid mechanism.

21. The method of testing a circuit interrupter according to claim 20,
wherein the circuit interrupter is a ground fault circuit interrupter, wherein the circuit interrupter comprises a circuit interrupting actuation circuit comprising:
a current transformer;
a phase conductor; and
a neutral conductor,
the phase and neutral conductors each having a line side and a load side,
the phase conductor and the neutral conductor being each configured to pass through the transformer from the line side to the load side,
the line side and the load side of the phase and neutral conductors being defined by the current transformer, and
the method further comprising the steps of:
coupling electrical power to the fault current test circuit; and
continuously at least partially testing the operability of the circuit interrupting circuit by establishing a continuous current imbalance one of: (a) between the load side of the phase conductor and the line side of the neutral conductor; and (b) between the line side of the phase conductor and the load side of the neutral conductor.

22. The method of testing a circuit interrupter according to claim 21, further comprising the step of:

electrically coupling a continuous test conductor one of (a) between the load side of the phase conductor and the line side of the neutral conductor; and (b) between the line side of the phase conductor and the load side of the neutral conductor, respectively,
wherein the ground fault circuit interrupter is configured to allow passage of the continuous current imbalance via the continuous test conductor electrically coupling one of (a) the load side of the phase conductor and the line side of the neutral conductor;
and (b) the line side of the phase conductor and the load side of the neutral conductor, respectively,
providing a fault generator circuit electrically coupled in the continuous test conductor; and
generating the continuous test fault current in the continuous test conductor via the fault generator circuit.

23. The method of testing a circuit interrupter according to claim 18, further comprising the steps of:
providing a current transformer, a phase conductor and a neutral conductor; and
configuring the phase conductor and the neutral conductor to pass through the current transformer from the line side to the load side,
the line side and the load side of the phase and neutral conductors being defined by the current transformer.

24. The method of testing a circuit interrupter according to claim 23, further comprising the steps of:
electrically coupling an integrated circuit to the current transformer; and
detecting the continuous test fault current via the integrated circuit.

25. The method of testing a circuit interrupter according to claim 24, further comprising the step of:
substantially nulling the continuous test fault current.

26. The method of testing a circuit interrupter according to claim 24, further comprising the steps of:
detecting the current imbalance via the current transformer; and
initiating a trip signal to decouple at least one of (1) the load side of the phase conductor from the line side of the phase conductor, and (2) the load side of the neutral conductor from the line side of the neutral conductor, if the current imbalance detected by the current transformer is greater than the sum of a predetermined magnitude and the continuous test fault current.

27. A method of testing a circuit interrupter comprising the steps of:
providing a circuit interrupter;
coupling electrical power to the circuit interrupter;
continuously at least partially testing operability of the circuit interrupter using a fault current test circuit without user intervention;
wherein the circuit interrupter is one of the group consisting of a (a) a ground fault circuit interrupter (GFCI); (b) arc fault circuit interrupter (ACFI); (c) immersion detection circuit interrupter (IDCI); (d) appliance leakage circuit interrupter (ALCI); (e) circuit breaker; (f) contactor; (g) latching relay; and (h) solenoid mechanism,
wherein the circuit interrupter comprises a circuit interrupting actuation circuit comprising:
a current transformer;
a phase conductor; and
a neutral conductor,
the phase and neutral conductors each having a line side and a load side, the phase conductor and the neutral conductor being each
configured to pass through the transformer from the line
side to the load side, the line side and the load side of the phase and neutral
conductors being defined by the current transformer, coupling electrical power to the fault current test circuit;

continuously at least partially testing the operability of the
circuit interrupting circuit by establishing a continuous
current imbalance one of: (a) between the load side of
the phase conductor and the line side of the neutral
conductor; and (b) between the line side of the phase
conductor and the load side of the neutral conductor;

electrically coupling a continuous test conductor one of (a)
between the load side of the phase conductor and the line
side of the neutral conductor; and (b) between the line
side of the phase conductor and the load side of the
neutral conductor, respectively;

wherein the ground fault circuit interrupter is configured to
allow passage of the continuous current imbalance via
the continuous test conductor electrically coupling one
of (a) the load side of the phase conductor and the line
side of the neutral conductor; and (b) the line side of the phase conductor and the load side of the
neutral conductor, respectively, providing a fault generator circuit electrically coupled in
the continuous test conductor;

generating the continuous test fault current in the continuous test conductor via the fault generator circuit;

electrically coupling an integrated circuit to the current
transformer;

detecting the continuous test fault current via the integrated
circuit;

providing an autogain circuit electrically coupled to the
current transformer and to the integrated circuit; and substantially nulling the continuous test fault current
detected by the integrated circuit via the autogain circuit.

28. The method of testing a circuit interrupter according to
claim 22, further comprising the step of:

electrically coupling an impedance load in the continuous
test conductor, wherein the magnitude of the continuous
test current is proportional to the magnitude of the
impedance load.

29. The method of testing a circuit interrupter according to
claim 28 wherein the impedance load is at least one of (a) a
resistive load; (b) a capacitive load;
and (c) an inductive load.

30. The method of testing a circuit interrupter according to
claim 28, further comprising the steps of:

electrically coupling a fault detection circuit in the continuous test conductor; and detecting the continuous fault current.

31. The method of testing a circuit interrupter according to
claim 21, further comprising the steps of:

providing an integrated circuit receiving power one of (a)
across the load side of the phase conductor and the line
side of the neutral conductor, and (b) across the line side
of the phase conductor and the load side of the neutral
conductor, said integrated circuit being energized by a
quiescent current thereby;

establishing the current imbalance by the quiescent current; and detecting, via the current transformer, the quiescent current
as the continuous test current.

32. The method of testing a circuit interrupter according to
claim 31, further comprising the steps of:

electrically coupling a rectifier to the integrated circuit; and electrically coupling a conductor one of (a) between the
line side of the phase conductor and the load side of the
neutral conductor; and (b) between the load side of the
phase conductor and the line side of the neutral conductor to establish the quiescent current thereby.

33. The method of testing a circuit interrupter according to
claim 31, further comprising the steps of:

configuring the current transformer to detect the current
imbalance; and initiating a trip signal by the integrated circuit if the current
imbalance detected by the current transformer is greater
than the sum of a predetermined magnitude and the
continuous test fault current.

34. The method of testing a circuit interrupter according to
claim 33, wherein the integrated circuit is configured and disposed to
initiate a trip signal to decouple at least one of (1) the
load side of the phase conductor from the line side of the
phase conductor and (2) the load side of the neutral
conductor from the line side of the neutral conductor.

35. A method of testing a circuit interrupter comprising the
steps of:

providing a circuit interrupter;

coupling electrical power to the circuit interrupter;

continuously at least partially testing operability of the
circuit interrupter using a fault current test circuit without user intervention;

wherein the circuit interrupter is one of the group consisting of a (a) a ground fault circuit interrupter (GFCI); (b)
arc fault circuit interrupter (ACFI); (c) immersion detection circuit interrupter (IDCI); (d) appliance leakage
circuit interrupter (ALCI); (e) circuit breaker; (f) contactor; (g) latching relay; and (h) solenoid mechanism, wherein the circuit interrupter comprises a circuit interrupting actuation circuit comprising:

a current transformer;

a phase conductor; and a neutral conductor, the phase and neutral conductors each having a line side
and a load side, the phase conductor and the neutral conductor being each
configured to pass through the transformer from the line
side to the load side, the line side and the load side of the phase and neutral
conductors being defined by the current transformer, the method further comprising:

coupling electrical power to the fault current test circuit;

continuously at least partially testing the operability of the
circuit interrupting circuit by establishing a continuous
current imbalance one of: (a) between the load side of
the phase conductor and the line side of the neutral
conductor; and (b) between the line side of the phase
conductor and the load side of the neutral conductor;

electrically coupling an autogain controller to the integrated circuit; and substantially nulling, via the autogain controller, the current imbalance received as the quiescent current by the
integrated circuit.

36. A method of manufacturing a circuit interrupter comprising the steps of:

providing a circuit interrupter;

configuring the circuit interrupter to receive electrical
power from a power source; and configuring the circuit interrupter with circuitry to continuously generate a continuous test current to enable at least partial continuous testing of the circuit interrupter when electrical power is received by the circuit interrupter without user intervention.

37. The method of manufacturing a circuit interrupter according to claim 36,
wherein the circuit interrupter is one of the group consisting of a (a) a ground fault circuit interrupter (GFCI); (b) arc fault circuit interrupter (ACFI); (c) immersion detection circuit interrupter (IDCI); (d) appliance leakage circuit interrupter (ALCI); (e) circuit breaker; (f) contactor; (g) latching relay; and (h) solenoid mechanism.

38. The method of manufacturing a circuit interrupter according to claim 37,
wherein the circuit interrupter is a ground fault circuit interrupter and the step of configuring the circuit interrupter with circuitry to enable at least partial continuous testing of the circuit interrupter when electrical power is received by the circuit interrupter is performed by configuring the ground fault circuit interrupter with circuitry allowing passage of the continuous test current therein to enable at least partial continuous testing of the ground fault circuit interrupter when electrical power is received by the circuit interrupter.

39. The method of manufacturing a circuit interrupter according to claim 38,
wherein the circuitry of the ground fault circuit interrupter comprises:
a phase conductor having a line side and a load side; and
a neutral conductor having a line side and a load side, and
wherein the step of configuring the ground fault circuit interrupter with circuitry allowing passage of the continuous test current therein to enable the at least partial continuous testing is performed by:
configuring the ground fault circuit interrupter to allow passage of the continuous test current as a continuous current imbalance one of (a) between the load side of the phase conductor and the line side of the neutral conductor; and (b) between the line side of the phase conductor and the load side of the neutral conductor.

40. The method of manufacturing a circuit interrupter according to claim 39, further comprising the steps of:
providing a current transformer; and
configuring the phase conductor and the neutral conductor each to pass through the transformer from the line side to the load side,
the line side and the load side of the phase and neutral conductors being defined by the current transformer.

41. The method of manufacturing a circuit interrupter according to claim 40,
wherein the step of configuring the ground fault circuit interrupter to allow passage of the continuous test current as a continuous current imbalance is performed by electrically coupling a continuous test conductor one of (a) between the load side of the phase conductor and the line side of the neutral conductor; and (b) between the line side of the phase conductor and the load side of the neutral conductor, respectively, establishing the continuous test fault current in the continuous test conductor thereby.

42. The method of manufacturing a circuit interrupter according to claim 41, further comprising the step of:
configuring the ground fault circuit interrupter to initiate a trip signal to decouple at least one of (1) the load side of the phase conductor from the line side of the phase conductor, and (2) the load side of the neutral conductor from the line side of the neutral conductor if the current imbalance is greater than the sum of a predetermined magnitude and the continuous test fault current.

43. The method of manufacturing a circuit interrupter according to claim 38, further comprising the step of:
configuring the ground fault circuit interrupter to substantially null the continuous test fault current.

44. The method of manufacturing a circuit interrupter according to claim 40, further comprising the steps of:
providing an integrated circuit configured and disposed to receive power one of (a) across the load side of the phase conductor and the line side of the neutral conductor, and (b) across the line side of the phase conductor and the load side of the neutral conductor, respectively, said integrated circuit being energized by a quiescent current thereby,
configuring the ground fault circuit interrupter wherein the current imbalance is the quiescent current; and
configuring and electrically coupling the current transformer to detect the quiescent current as the continuous test current.

45. The method of manufacturing a circuit interrupter according to claim 40, further comprising the steps of:
providing a rectifier electrically coupled to the integrated circuit; and
electrically coupling the rectifier via a conductor one of: (a) between the line side of the phase conductor and the load side of the neutral conductor; and (b) between the load side of the phase conductor and the line side of the neutral conductor, the quiescent current being established thereby.

46. The method of manufacturing a circuit interrupter according to claim 45, further comprising the step of:
configuring the ground fault circuit interrupter to initiate a trip signal to decouple at least one of (1) the load side of the phase conductor from the line side of the phase conductor, and (2) the load side of the neutral conductor from the line side of the neutral conductor if the current imbalance is greater than the sum of a predetermined magnitude and the continuous test fault current.

47. A method of manufacturing a circuit interrupter comprising the steps of:
providing a circuit interrupter;
configuring the circuit interrupter to receive electrical power from a power source:
configuring the circuit interrupter with circuitry to enable at least partial continuous testing of the circuit interrupter when electrical power is received by the circuit interrupter without user intervention,
wherein the circuit interrupter is one of the group consisting of a (a) a ground fault circuit interrupter (GFCI); (b) arc fault circuit interrupter (ACFI); (c) immersion detection circuit interrupter (IDCI); (d) appliance leakage circuit interrupter (ALCI); (e) circuit breaker; (f) contactor; (g) latching relay; and (h) solenoid mechanism,
wherein the step of configuring the circuit interrupter with circuitry to enable at least partial continuous testing of the circuit interrupter when electrical power is received by the circuit interrupter is performed by configuring the circuit interrupter with circuitry allowing passage of a continuous test current therein to enable at least partial continuous testing of the circuit interrupter when electrical power is received by the circuit interrupter,
wherein the circuitry of the circuit interrupter comprises:
a phase conductor having a line side and a load side; and
a neutral conductor having a line side and a load side, and wherein the step of configuring the circuit interrupter with circuitry allowing passage of the continuous test current therein to enable the at least partial continuous testing is performed by:
configuring the circuit interrupter to allow passage of the continuous test current as a continuous current imbalance one of (a) between the load side of the phase conductor and the line side of the neutral conductor; and (b) between the line side of the phase conductor and the load side of the neutral conductor,
further comprising the steps of:
providing a current transformer; and
configuring the phase conductor and the neutral conductor each to pass through the transformer from the line side to the load side,
wherein the line side and the load side of the phase and neutral conductors being defined by the current transformer,
providing an integrated circuit configured and disposed to receive power one of (a) across the load side of the phase conductor and the line side of the neutral conductor, and (b) across the line side of the phase conductor and the load side of the neutral conductor, respectively, said integrated circuit being energized by a quiescent current thereby,
configuring the circuit interrupter wherein the current imbalance is the quiescent current;
configuring and electrically coupling the current transformer to detect the quiescent current as the continuous test current,
providing an autogain controller; and
electrically coupling the autogain controller to the integrated circuit wherein the autogain controller substantially nulls the current imbalance received as the quiescent current by the integrated circuit.

48. A circuit interrupter, comprising:
a circuit interrupting actuation circuit comprising a transformer;
a fault current test circuit disposed and electrically coupled to the circuit interrupting actuation circuit to continuously test at least partially the operability of the circuit interrupting actuation circuit using a continuous test fault current;
at least one integrated circuit electrically coupled to the current transformer; and
an autogain circuit electrically coupled to the transformer and to the at least one integrated circuit, wherein the autogain circuit is configured to substantially null the continuous test fault current detected by the at least one integrated circuit.

49. The circuit interrupter according to claim 48, wherein the circuit interrupting actuation circuit further comprises:
a phase conductor having line and load sides, wherein the phase conductor is configured to pass through the transformer, the line side and the load side of the phase conductor is defined by the transformer; and
a neutral conductor having line and load sides, wherein the neutral conductor is configured to pass through the transformer, the line side and the load side of the neutral conductor is defined by the transformer.

* * * * *